(12) United States Patent
Wang et al.

(10) Patent No.: US 10,886,181 B2
(45) Date of Patent: Jan. 5, 2021

(54) SEMICONDUCTOR DEVICE

(71) Applicants: Semiconductor Manufacturing International (Shanghai) Corporation, Shanghai (CN); SMIC New Technology Research and Development (Shanghai) Corporation, Shanghai (CN)

(72) Inventors: Zhi Dong Wang, Shanghai (CN); Cheng Long Zhang, Shanghai (CN); Wu Tao Tu, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/861,617

(22) Filed: Apr. 29, 2020

(65) Prior Publication Data
US 2020/0258787 A1 Aug. 13, 2020

Related U.S. Application Data

(62) Division of application No. 16/234,038, filed on Dec. 27, 2018, now Pat. No. 10,679,902.

(30) Foreign Application Priority Data

Dec. 29, 2017 (CN) .......................... 2017 1 1486021

(51) Int. Cl.
*H01L 21/82* (2006.01)
*H01L 21/02* (2006.01)
(Continued)

(52) U.S. Cl.
CPC .. *H01L 21/823468* (2013.01); *H01L 21/0214* (2013.01); *H01L 21/0217* (2013.01);
(Continued)

(58) Field of Classification Search
CPC ....... H01L 21/823468; H01L 21/02126; H01L 21/0214; H01L 21/0217
(Continued)

(56) References Cited

U.S. PATENT DOCUMENTS 6,274,479 B1 * 8/2001 Srinivasan ........ H01L 21/02126
257/E21.243
6,380,030 B1 * 4/2002 Chen ................. H01L 29/42324
438/257

(Continued)

*Primary Examiner* — Sheikh Maruf
(74) *Attorney, Agent, or Firm* — Anova Law Group, PLLC

(57) ABSTRACT

Semiconductor device is provided. The semiconductor device includes a base substrate and a first dielectric layer on the base substrate. The first dielectric layer contains a first trench and a second trench passing therethrough, and a width of the second trench is larger than a width of the first trench. The semiconductor device further includes a first gate dielectric layer and a first gate electrode in the first trench. A first recess is on the first gate dielectric layer between the first gate electrode and the first dielectric layer. The semiconductor device further includes a second gate dielectric layer and a second gate electrode in the second trench. A second recess is on the second gate dielectric layer between the second gate electrode and the first dielectric layer. The semiconductor device further includes a first protection layer in the first recess and a second protection layer in the second recess.

11 Claims, 6 Drawing Sheets

(51) Int. Cl.
  *H01L 21/8234* (2006.01)
  *H01L 23/535* (2006.01)
  *H01L 21/28* (2006.01)
  *H01L 21/3105* (2006.01)
  *H01L 21/768* (2006.01)
  *H01L 29/66* (2006.01)
  *H01L 29/49* (2006.01)
  *H01L 29/51* (2006.01)
  *H01L 29/423* (2006.01)
  *H01L 27/088* (2006.01)
  *H01L 29/78* (2006.01)

(52) U.S. Cl.
  CPC .... *H01L 21/0228* (2013.01); *H01L 21/02126* (2013.01); *H01L 21/28088* (2013.01); *H01L 21/31055* (2013.01); *H01L 21/76805* (2013.01); *H01L 21/76895* (2013.01); *H01L 21/82345* (2013.01); *H01L 21/823418* (2013.01); *H01L 21/823431* (2013.01); *H01L 21/823456* (2013.01); *H01L 21/823475* (2013.01); *H01L 23/535* (2013.01); *H01L 27/088* (2013.01); *H01L 29/42376* (2013.01); *H01L 29/4966* (2013.01); *H01L 29/4983* (2013.01); *H01L 29/517* (2013.01); *H01L 29/6653* (2013.01); *H01L 29/66545* (2013.01); *H01L 29/785* (2013.01); *H01L 29/7848* (2013.01)

(58) Field of Classification Search
  USPC .......................................... 257/382; 438/300
  See application file for complete search history.

(56) References Cited

U.S. PATENT DOCUMENTS

| | | | |
|---|---|---|---|
| 2003/0207585 A1* | 11/2003 | Choi | H01L 21/31116 438/723 |
| 2004/0033677 A1* | 2/2004 | Arghavani | H01L 21/28247 438/510 |
| 2004/0087155 A1* | 5/2004 | Wieczorek | H01L 21/31111 438/689 |
| 2006/0079060 A1* | 4/2006 | Kwon | H01L 27/0266 438/300 |
| 2006/0091479 A1 | 5/2006 | Cho et al. | |
| 2009/0321942 A1* | 12/2009 | Sell | H01L 21/76895 257/763 |
| 2010/0059887 A1* | 3/2010 | Ueki | H01L 21/02203 257/741 |
| 2010/0323484 A1 | 12/2010 | Fukushima | |
| 2011/0241128 A1* | 10/2011 | O'Meara | H01L 21/28247 257/408 |
| 2011/0298017 A1 | 12/2011 | Jain et al. | |
| 2012/0025323 A1* | 2/2012 | Teo | H01L 21/823425 257/384 |
| 2012/0126295 A1* | 5/2012 | Edge | H01L 29/66545 257/288 |
| 2013/0248950 A1 | 9/2013 | Kang et al. | |
| 2014/0175659 A1 | 6/2014 | Lee et al. | |
| 2014/0187046 A1* | 7/2014 | Posseme | H01L 21/0234 438/696 |
| 2015/0162190 A1* | 6/2015 | Posseme | H01L 21/84 257/288 |
| 2015/0214219 A1 | 7/2015 | Cai et al. | |
| 2015/0235897 A1 | 8/2015 | Fu et al. | |
| 2017/0317076 A1 | 11/2017 | Shen et al. | |
| 2017/0317213 A1 | 11/2017 | Park et al. | |

* cited by examiner

SEMICONDUCTOR DEVICE

CROSS-REFERENCES TO RELATED APPLICATION

This application is a divisional of U.S. patent application Ser. No. 16/234,038, filed on Dec. 27, 2018, which claims the priority of Chinese Patent Application No. 201711486021.9, filed on Dec. 29, 2017, the content of which is incorporated herein by reference in its entirety.

TECHNICAL FIELD

The present disclosure generally relates to the field of semiconductor technologies and more particularly, relates to a semiconductor device and its fabrication method.

BACKGROUND

A metal-oxide-semiconductor (MOS) transistor is one of the most important devices in modern integrated circuits. An elementary structure of the MOS transistor includes: a semiconductor substrate, gate structures on a surface of the semiconductor substrate, source doped regions in the semiconductor substrate on one side of the gate structures and drain doped regions in the semiconductor substrate on another side of the gate structures. In the MOS transistor, voltages are applied on the gate structures to control currents flowing through channels under the gate structures and to produce on/off signals.

With continuous development in semiconductor technologies, conventional planar MOS transistors have a poor controlling ability on the channel current, which causes serious leakage current. A fin field effect transistor (FinFET) is an emerging multi-gate device. A FinFET usually includes fins protruding from the surface of the semiconductor substrate, gate structures covering a portion of top surfaces and sidewalls of the fins, source doped regions in the fins on one side of the gate structures, and drain doped regions in the fins on another side of the gate structures.

However, semiconductors devices formed by either planar MOS transistors or FinFETs have poor performance. The disclosed devices and methods are directed to at least partially alleviate one or more problems set forth above and to solve other problems in the art.

SUMMARY

One aspect of the present disclosure provides a method for fabricating a semiconductor structure. The method includes: providing a base substrate; forming a first dielectric layer on the base substrate; forming a first trench and a second trench passing through the first dielectric layer, where a width of the second trench is larger than a width of the first trench; forming a first gate dielectric layer and a first gate electrode on the first gate dielectric layer in the first trench, where the first gate dielectric layer is on the sidewalls and a bottom of the first trench; forming a second dielectric layer and a second gate electrode on the second gate dielectric layer in the second trench, where the second gate dielectric layer is on the sidewalls and a bottom of the second trench; forming a first recess between the first gate electrode and the first dielectric layer by etching a portion of the first gate dielectric layer along the sidewalls of the first trench; forming a second recess between the second gate electrode and the first dielectric layer by etching a portion of the second gate dielectric layer along the sidewalls of the second trench; forming a first protection layer in the first recess and a second protection layer in the second recess; and polishing surfaces of the first dielectric layer, the first protection layer and the second protection layer using the first gate electrode and the second gate electrode as a stop layer.

Another aspect of the present disclosure includes a semiconductor device. The semiconductor device includes: a base substrate; a first dielectric layer on the base substrate, where the first dielectric layer contains a first trench and a second trench passing therethrough, and a width of the second trench is larger than a width of the first trench; a first gate dielectric layer and a first gate electrode in the first trench, where the first gate dielectric layer is on a portion of sidewalls and a bottom of the first trench, the first gate electrode is on the first gate dielectric layer, and a first recess is on the first gate dielectric layer between the first gate electrode and the first dielectric layer; a second gate dielectric layer and a second gate electrode in the second trench, where the second gate dielectric layer is on a portion of sidewalls and a bottom of the second trench, the second gate electrode is on the second gate dielectric layer, and a second recess is on the second gate dielectric layer between the second gate electrode and the first dielectric layer; a first protection layer in the first recess; and a second protection layer in the second recess.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Semiconductor device and fabrication method are provided. The method includes: forming a first gate dielectric layer and a first gate electrode on the first gate dielectric layer in the first trench; forming a second dielectric layer and a second gate electrode on the second gate dielectric layer in the second trench; forming a first recess between the first gate electrode and the first dielectric layer by etching a portion of the first gate dielectric layer along the sidewalls of the first trench; forming a second recess between the second gate electrode and the first dielectric layer by etching a portion of the second gate dielectric layer along the sidewalls of the second trench; forming a first protection layer in the first recess and a second protection layer in the second recess; and polishing surfaces of the first dielectric layer, the first protection layer and the second protection layer using the first gate electrode and the second gate electrode as a stop layer.

Figure 1:
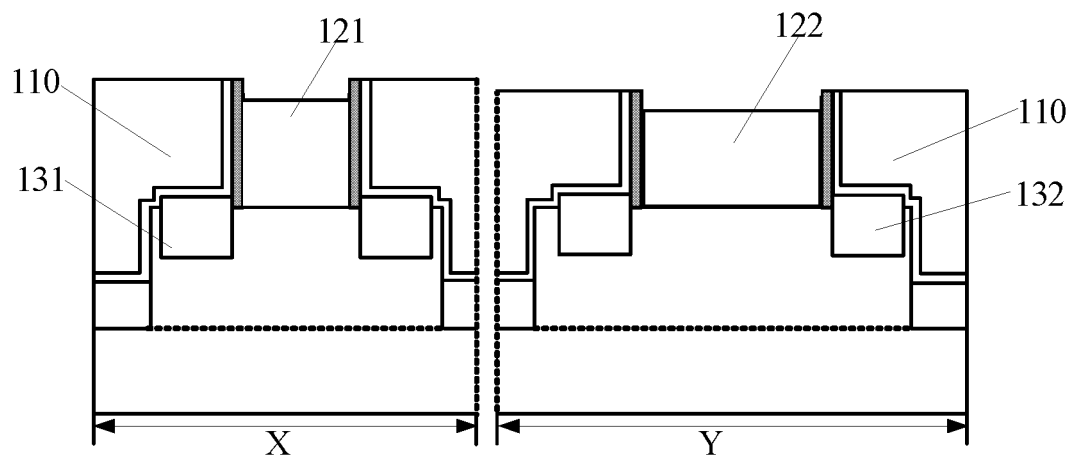
FIGS. 1-3 illustrate semiconductor structures corresponding to certain stages for forming a semiconductor device.
Figure 2:
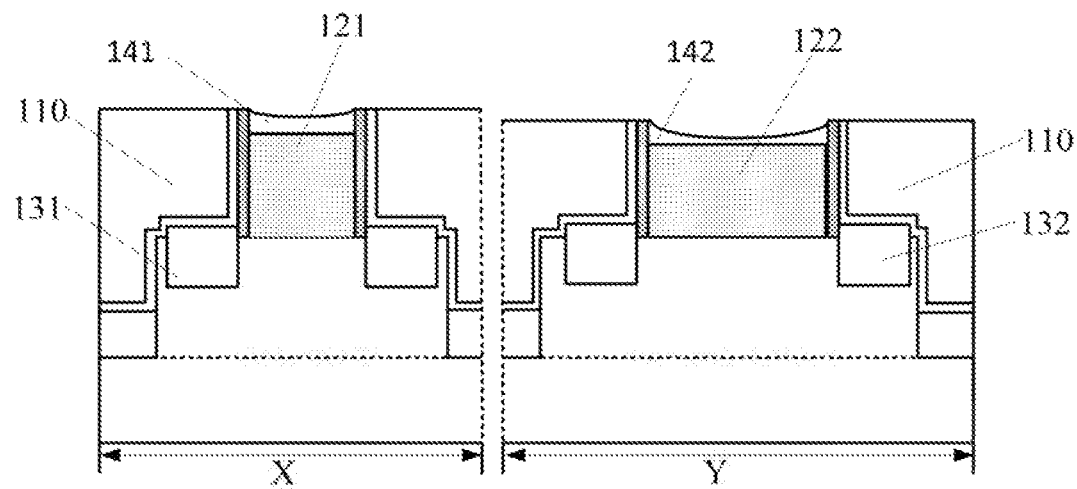
Figure 3:
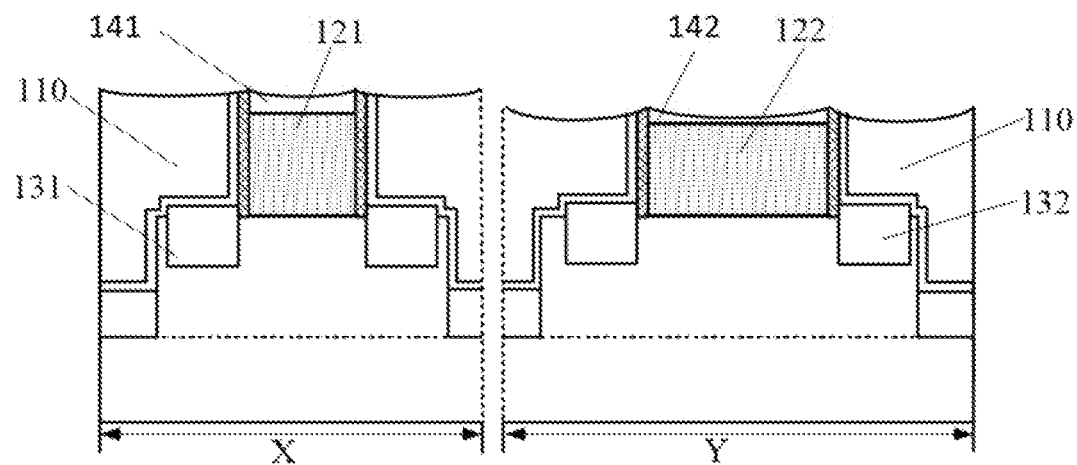

FIGS. 1-3 illustrate semiconductor structures corresponding to certain stages for forming a semiconductor device.

Referring to FIG. 1, a base substrate, having a bottom dielectric layer 110, with a first region X for forming a short channel transistor and a second region Y for forming a long channel transistor may be provided. The bottom dielectric layer 110 of the first region X may have a first trench passing through the bottom dielectric layer 110. The bottom dielectric layer 110 of the second region Y may have a second trench passing through the bottom dielectric layer 110. A width of the second trench may be larger than a width of the first trench. A first gate structure 121 may be formed in the first trench, where the top surface of the first gate structure 121 may be lower than the surface of the bottom dielectric layer 110 of the first region X. A second gate structure 122 may be formed in the second trench, where the top surface of the second gate structure 122 may be lower than the surface of the bottom dielectric layer 110 of the second region Y.

A first source/drain doped layer 131 may be formed in the base substrate on each side of the first gate structure 121. A second source/drain doped layer 132 may be formed in the base substrate on each side of the second gate structure 122. The bottom dielectric layer 110 may be over the first source/drain doped layer 131 and the second source/drain doped layer 132.

The method for forming the first gate structure 121 and the second gate structure 122 may include: forming a gate dielectric film and a gate electrode film which is on the gate dielectric film in the first and second trenches and on the bottom dielectric layer 110; exposing the surface of the bottom dielectric layer 110 by polishing the gate electrode film and the gate dielectric film, and forming a first initial gate structure in the first trench and a second initial gate structure in the second trench; forming the first gate structure 121 by etching back the first initial gate structure and the second gate structure 122 by etching back the second initial gate structure.

In order to remove the gate electrode film and the gate dielectric film on the top surface of the bottom dielectric layer 110, an over-polishing may be performed for polishing the gate electrode film and the gate dielectric film. The over-polishing of the gate electrode film and the gate dielectric film is referred to as a first over-polishing, which may also polish the bottom dielectric layer 110. Because of less hardness of the bottom dielectric layer 110 than the hardness of the gate electrode film, the first over-polishing process may scratch the surface of the bottom dielectric layer 110 and may further embed the gate electrode film material in the top surface of the bottom dielectric layer 110 surrounding the first trench and the second trench. The material of the gate electrode film embedding in the top surface of the bottom dielectric layer 110 surrounding the first trench is referred to as a first embedding material, and the material of the gate electrode film embedding in the top surface of the bottom dielectric layer 110 surrounding the second trench is referred to as a second embedding material. The binding force between the first and second embedding materials and the bottom dielectric layer 110 may be large, and the first and second embedding material may be difficult to remove, which cause the connection between the first initial gate structure and the first embedding material, and the connection between the second initial gate structure and the second embedding material.

The first gate structure 121 may be formed by etching back the first initial gate structure, and the second gate structure 122 may be formed by etching back the second initial gate structure. The direct connection between the first gate structure 121 and the first embedding material may be avoided, and also the leakage between the first gate structure 121 and the subsequent first plug due to the direct connection between the first gate structure 121 and the first embedding material may be avoided. The direct connection between the second gate structure 122 and the second embedding material may be avoided, and also the leakage between the second gate structure and the subsequent second plug due to the direct connection between the second gate structure 122 and the second embedding material may be avoided.

Referring to FIG. 2, a first protection layer 141 may be formed on the top surface of the first gate structure 121 in the first trench. During forming the first protection layer 141, a second protection layer 142 may be formed on the top surface of the second gate structure 122 in the second trench.

The method for forming the first protection layer 141 and the second protection layer 142 may include: forming a protection film in the first and second trenches and also on the surface of the bottom dielectric layer 110; polishing the protection film to expose the surface of the bottom dielectric layer 110 using a chemical mechanical polishing process, and then forming the first protection layer 141 and the second protection layer 142.

The first protection layer 141 may isolate the first gate structure 121 and the first embedding material. The first protection layer 141 may have a large dielectric constant, which may improve the breakdown resistance and avoid the leakage between the first gate structure 121 and the first embedding material. The second protection layer 142 may isolate the second gate structure 122 and the second embedding material. The second protection layer 142 may have a large dielectric constant, which may improve the breakdown resistance and avoid the leakage between the second gate structure 122 and the second embedding material.

Referring to FIG. 3, the surface of the bottom dielectric layer 110 may be trimmed and polished using the first protection layer 141 and second protection layer 142 as a stop layer.

The trimming and polishing process may make the top surface of the first protection layer 141 and the surface of the bottom dielectric layer 110 in the first region X have a similar heights, and also make the top surface of the second protection layer 142 and the surface of the bottom dielectric layer 110 in the second region Y have similar heights.

Polishing the protection film using the chemical mechanical polishing process may improve the flatness of the top surface of the bottom dielectric layer 110. Over-polishing may be needed for polishing the protection film, and may ensure that the protection film on the top surface of the bottom dielectric layer 110 at different regions is removed. The over-polishing of the protection film is referred to as a second over-polishing. A portion of the protection film in the first and second trenches may be removed. The polishing pad of the second over-polishing may be bent toward the protection film in the second trench under stress, and the curvature of the polishing pad toward the center of the second trench may be larger than the curvature of the polishing pad toward the edge of the second trench. The width of the second trench may be larger than the width of the first trench, where the width of the second trench may be large. The curvature of the polishing pad toward the center of the second trench may be larger than the curvature of the polishing pad toward the first trench, and the bent polishing pad may contact the protection film in the first and second trenches, which may cause the loss of the protection film in the second trench to be larger than the loss of the protection film in the first trench.

The trimming and polishing process may use the first protection layer 141 and second protection layer 142 as a stop layer. After this trimming and polishing process, the surface of the bottom dielectric layer 110 in the second region Y may be lower than the surface of the bottom dielectric layer 110 in the first region X, and the height difference between the surface of the dielectric layer 110 in the second region Y and the surface of the dielectric layer 110 in the first region X may be large, which may not meet requirements of the process design.

Subsequently, the method may further include: etching the bottom dielectric layer 110 on each side of the first gate structure 121 and forming first through holes on each side of the first gate structure 121 which may pass through the bottom dielectric layer 110 and expose the surface of the first source/drain doped layer 131; in the process for etching the bottom dielectric layer 110 on each side of the first gate structure 121, etching the bottom dielectric layer 110 on each side of the second gate structure 122 and forming second though holes on each side of the second gate structure 122, which may pass through the bottom dielectric layer 110 and expose the surface of the second source/drain doped layer 132; forming first plugs in the first through holes and forming second plugs in the second through holes.

In the process for forming the first and second through holes, the required time for etching the bottom dielectric layer 110 in the second region Y may be less than the required time for etching the bottom dielectric layer 110 in the first region X. The second source/drain doped layer 132 may be exposed for long time in the etching process for forming the first and second through holes, and the formation process for the first and second through holes may cause the large loss of the second source/drain doped layer 132, which may reduce the electrical performance of the second region Y transistor such as a large strain loss from the second source/drain doped layer 132 in the channel of the second region Y and also may have a low carrier mobility in the channel of the second region Y.

The present disclosure provides a semiconductor device and its fabrication method. A width of a second trench may be larger than a width of a first trench; etching a portion of a first gate dielectric layer on sidewalls of the first trench to form a first recess between a first gate electrode and the first dielectric layer; etching a portion of a second gate dielectric layer on sidewalls of the second trench to form a second recess between a second gate electrode and the first dielectric layer; forming a first protection layer in the first recess and a second protection layer in the second recess; trimming and polishing the surfaces of the first dielectric layer and the top surfaces of the first and second protection layers using the first and second gate electrodes as a stop layer. This method may improve the performance of semiconductor devices.

FIGS. 4-10 illustrate semiconductor structures corresponding to certain stages for forming an exemplary semiconductor device according to various disclosed embodiments of the present disclosure.

Figure 4:
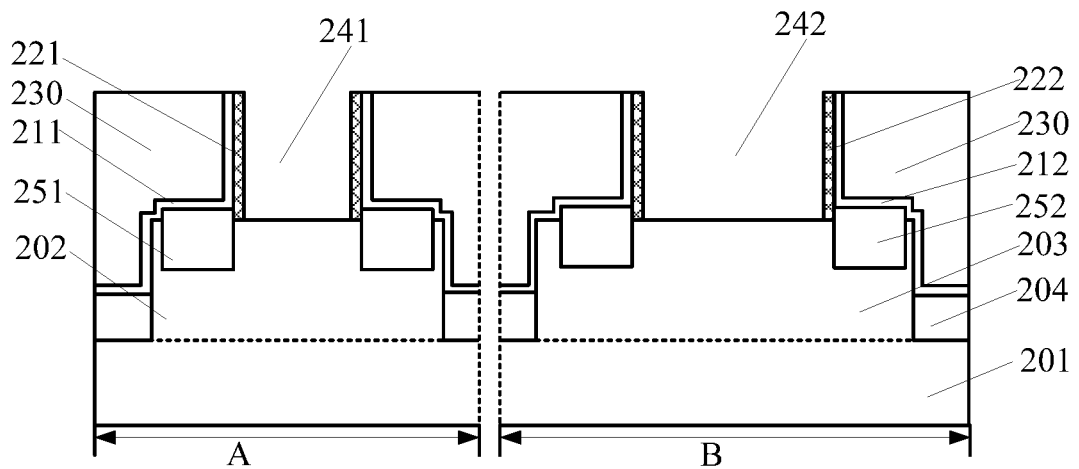
FIGS. 4-10 illustrate semiconductor structures corresponding to certain stages for forming an exemplary semiconductor device according to various disclosed embodiments of the present disclosure.

Referring to FIG. 4, a base substrate with a first dielectric layer 230 on the base substrate may be provided. The first dielectric layer 230 may have a first trench 241 and a second trench 242 which may pass through the first dielectric layer 230. A width of the second trench 242 may be larger than a width of the first trench 241.

For illustration purposes, the present disclosure is described using an embodiment that the semiconductor device is a FinFET. In other embodiments, the semiconductor device may be a planar MOS transistor.

The base substrate may include a first region A and a second region B. The channel length for forming a transistor in the second region B may be larger than the channel length for forming a transistor in the first region A.

In one embodiment, the base substrate may include a semiconductor substrate 201 and fins on the semiconductor substrate 201. In other embodiments, the base substrate may be a planar semiconductor substrate.

The semiconductor substrate 201 may be made of single crystalline silicon, polycrystalline silicon and amorphous silicon. The semiconductor substrate 201 may further be made of silicon, germanium, silicon germanium, gallium arsenide and/or any other suitable semiconductor material(s). In one embodiment, the semiconductor substrate 201 may be made of silicon, for example.

The fins may include a first fin 202 in the first region A and a second fin 203 in the second region B.

Isolation structures 204 may be on the semiconductor substrate 201 and cover a portion of sidewalls of the first fin 202 and the second fin 203. The top surface of the isolation structures 204 may be lower than the top surface of the first fin 202 and also the top surface of the second fin 203. The isolation structures 204 may be used to electrically isolate adjacent fins. The isolation structures 204 may be made of silicon dioxide and/or any other suitable material(s).

In one embodiment, the first trench 241 and the second trench 242 may expose a portion of the sidewalls and the top surfaces of the fins. Specifically, the first trench 241 may expose a portion of the sidewalls and the top surfaces of the first fin 202, and the second trench 242 may expose a portion of the sidewalls and the top surfaces of the second fin 203.

The width of the second trench 242 may be larger than the width of the first trench 241. The width of the first trench 241 is referred to as the size of the first trench 241 along a direction in parallel with a surface of the semiconductor substrate 201 and perpendicular to an extending direction of the first trench 241. The width of the second trench 242 is referred as the size of the second trench 242 along a direction in parallel with a surface of the semiconductor substrate 201 and perpendicular to an extending direction of the second trench 242.

The size of the first trench 241 may be about 26 nm to about 30 nm in a direction perpendicular to an extending direction of the first trench 241 and in parallel with a surface of the base substrate; and the size of the second trench 242 may be about 65 nm to about 75 nm in a direction perpendicular to an extending direction of the second trench 242 and in parallel with a surface of the base substrate.

A first spacer 221 may be formed on the sidewall of the first trench 241 and a second spacer 222 may be formed on the sidewall of the second trench 242.

In one embodiment, the method may further include: before forming the first dielectric layer 230, forming a first source/drain doped layer 251 in the first region A of the base substrate and forming a second source/drain doped layer 252 in the second region B of the base substrate; the first dielectric layer 230 over the first source/drain doped layer 251 and the second source/drain doped layer 252; and the first source/drain doped layer 251 on each side of the first trench 241 and the second source/drain doped layer 252 on each side of the second trench 242.

In one embodiment, the method may further include: forming a first stop layer 211 on the top of the first source/drain doped layer 251 and forming a second stop layer 212 on the top of the second source/drain doped layer 252; the first stop layer 211 on the sidewalls of the first spacers 221 and on the surface of the isolation structures 204 in the first region A; the second stop layer 212 on the sidewalls of the second spacers 222 and on the surface of the isolation structures 204 in the second region B; the first dielectric layer 230 covering the first stop layer 211 on the surface of the first source/drain doped layer 251, the first stop layer 211 on the surface of the isolation structures 204 in the region A, and the sidewall surfaces of the first stop layer 211 on the sidewalls of the first spacers 221; the first dielectric layer 230 also covering the second stop layer 212 on the surface of the second source/drain doped layer 252, the second stop layer 212 on the surface of the isolation structures 204 in the region B, and the sidewall surfaces of the second stop layer 212 on the sidewalls of the second spacers 222.

The method may include: providing a base substrate; forming a first dummy gate structure on the first region A of the base substrate and forming a second dummy gate structure on the second region B of the base substrate; forming first spacers 221 on the sidewalls of the first dummy gate structure and forming second spacers 222 on the sidewalls of the second dummy gate structure; forming the first source/drain doped layer 251 in the base substrate of the first dummy gate structure and on sides of the first spacers 221, where the first source/drain doped layer 251 may be formed in the first dummy gate structure and the first fin 202 on sides of the first spacers 221; forming the second source/drain doped layer 252 in the base substrate of the second dummy gate structure and on sides of the second spacers 222 where the second source/drain doped layer 252 may be formed in the second dummy gate structure and the second fin 203 on sides of the second spacers 222; after forming the first source/drain doped layer 251 and the second source/drain doped layer 252, forming the first stop layer 211, the second stop layer 212 and the first dielectric layer 230; forming the first trench 241 in the first dielectric layer 230 in the first region A by removing the first dummy gate structure, and forming the second trench 242 in the first dielectric layer 230 of the second region B by removing the second dummy gate structure.

The first dielectric layer 230 may be made of silicon dioxide and/or any other suitable material(s). The material of the first dielectric layer 230 may be formed by a deposition process such as a flowable chemical vapor deposition process. The hardness of the first dielectric layer 230 may be less than the hardness of the subsequent second dielectric layer.

The first stop layer 211 may be made of silicon nitride, silicon oxynitride, silicon oxycarbonitride, silicon oxyboronitride, or silicon oxyborocarbonitride. The second stop layer 212 may be made of silicon nitride, silicon oxynitride, silicon oxycarbonitride, silicon oxyboronitride, or silicon oxyborocarbonitride.

The thickness of the first stop layer 211 may be about 45 Angstrom to about 55 Angstrom and the thickness of the second stop layer 212 may be about 45 Angstrom to about 55 Angstrom. The thickness of the first stop layer 211 and the second stop layer 212 may not be large. If the thickness of the first stop layer 211 and the second stop layer 212 are large, the strain from the first stop layer 211 in the first source/drain doped layer 251 may be large and the strain from the second stop layer 212 in the second source/drain doped layer 252 may be large.

In other embodiments, the first stop layer and the second stop layer may not be formed.

Figure 5:
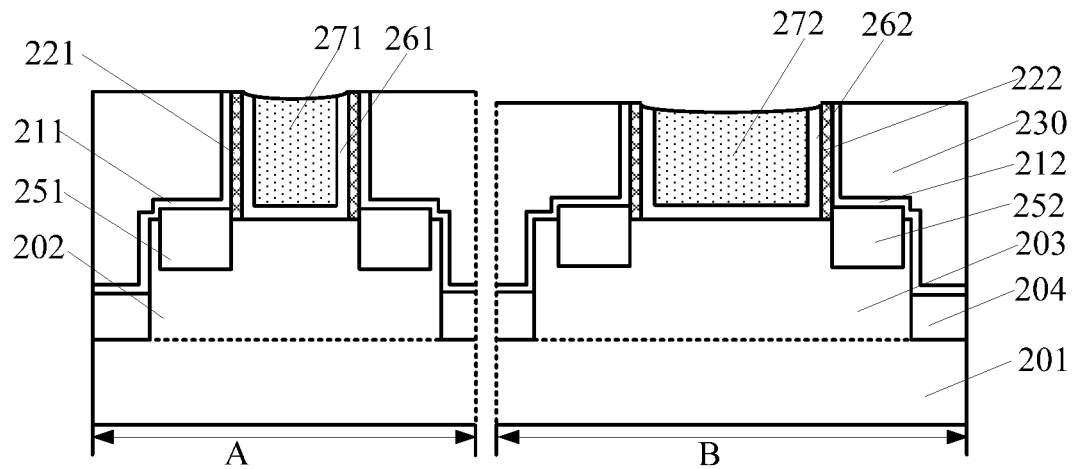

Referring to FIG. 5, a first gate dielectric layer 261 and a first gate electrode 271 on the first gate dielectric layer 261 may be formed in the first trench 241 (referring to FIG. 4), and the first gate dielectric layer 261 may be on the sidewalls and the bottom of the first trench 241; a second gate dielectric layer 262 and a second gate electrode 272 on the second gate dielectric layer 262 may be formed in the second trench 242 (referring to FIG. 4) and the second gate dielectric layer 262 may be on the sidewalls and the bottom of the second trench 242.

A width of the second gate electrode 272 may be larger than a width of the first gate electrode 271.

The width of the first gate electrode 271 is referred to as the size of the first gate electrode 271 along a direction in parallel with a surface of the semiconductor substrate 201 and perpendicular to an extending direction of the first gate electrode 271. The width of the second gate electrode 272 is referred to as the size of the second gate electrode 272 along a direction in parallel with a surface of the semiconductor substrate 201 and perpendicular to an extending direction of the second gate electrode 272.

The first gate electrode 271 and the second gate electrode 272 may be made of a metal. The first gate dielectric layer 261 and the second gate dielectric layer 262 may be made of a high-K (K is greater than 3.9) dielectric material.

The first source/drain doped layer 251 may be in the base substrate on sides of the first gate electrode 271, where the first source/drain doped layer 251 may be formed in the first fin 202 on sides of the first gate electrode 271. The second source/drain doped layer 252 may be in the base substrate on sides of the second gate electrode 272, where the second source/drain doped layer 252 may be formed in the second fin 203 on sides of the second gate electrode 272.

The first spacers 221 may be located between the first gate dielectric layer 261 and the first dielectric layer 230 in the first region A, and the second spacers 222 may be located between the second gate dielectric layer 262 and the second dielectric layer 230 in the second region B.

The method for forming the first gate dielectric layer 261, the first gate electrode 271, the second gate dielectric layer 262 and the second gate electrode 272 may include: forming a gate dielectric film on the sidewalls and the bottom of the first trench 241, on the sidewalls and the bottom of the second trench 242, on the first spacers 221 and the second spacers 222, and on the first dielectric layer 230; forming a gate electrode film on the gate dielectric layer, where the surface of the gate electrode film may be higher than the surface of the first dielectric layer 230; and polishing the gate electrode film and the gate dielectric film using a chemical mechanical polishing process to expose the surface of the first dielectric layer 230 in the region A, the surface of the first dielectric layer 230 in the region B and the top surface of the first spacers 221 and the second spacers 222.

In order to remove the gate dielectric film and the gate electrode film on the surface of the first dielectric layer 230 in the region A, on the first spacers 221, on the surface of the first dielectric layer 230 in the region B and on the second spacers 222, an over-polishing process may be performed on the gate dielectric film and the gate electrode film.

The width of the second trench 242 may be larger than the width of the first trench 241. Since the second gate electrode 272 may have large hardness, the process for forming the second gate electrode 272 may have small loss of the surface material at the top of the second gate electrode 272. More specifically, the over-polishing process may have small loss of the surface material at the top of the second gate electrode 272. Since the first gate electrode 271 may have large hardness, the process for forming the first gate electrode 271 may have small loss of the surface material at the top the first gate electrode 271. More specifically, the over-polishing process have small loss of the surface material at the top of the first gate electrode 271.

The over-polishing process may also polish the first dielectric layer 230. Because of less hardness of the first dielectric layer 230 than the hardness of the gate electrode film, the over-polishing process may scratch the surface of the first dielectric layer 230 and may further embed the gate electrode film material in the top surface of the first dielectric layer 230 surrounding the first trench 241 and the second trench 242. The gate electrode film material embedding in the top surface of the first dielectric layer 230 surrounding the first trench 241 is referred to as a first embedding material, and the gate electrode film material embedding in the top surface of the first dielectric layer 230 surrounding the second trench 242 is referred to as a second embedding material. The binding force between the first and second embedding material and the first dielectric layer 230 may be large, so the first and second embedding material may be difficult to remove. Correspondingly, before the subsequent etching of a portion of the first gate dielectric layer 261 on the sidewalls of the first trench 241 and a portion of the second gate dielectric layer 262 on the sidewalls of the second trench 242, the first gate electrode 271 and the first gate dielectric layer 261 may connect with the first embedding material, and the second gate electrode 272 and the second gate dielectric layer 262 may connect with the second embedding material.

Figure 6:
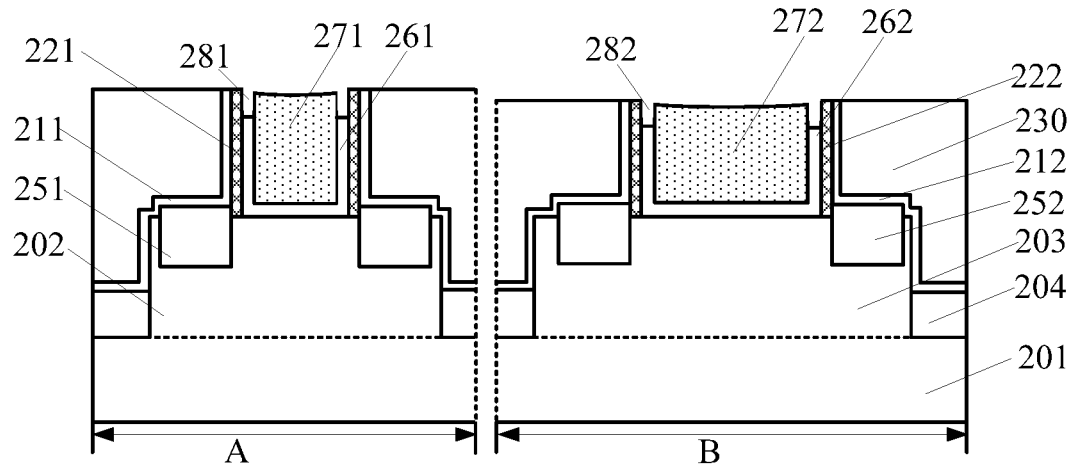

Referring to FIG. 6, a portion of the first gate dielectric layer 261 on the sidewalls of the first trench 241 (referring to FIG. 4) may be etched to form a first recess 281 between the first gate electrode 271 and the first dielectric layer 230; and a portion of the second gate dielectric layer 262 on the sidewalls of the second trench 242 (referring to FIG. 4) may be etched to form a second recess 282 between the second gate electrode 272 and the first dielectric layer 230.

In the process of etching a portion of the first gate dielectric layer 261 on the sidewalls of the first trench 241, the first embedding material connected to the first gate dielectric layer 261 may be etched and removed, which may disconnect the first gate electrode 271 and the first embedding material and may avoid the leakage between the first gate electrode 271 and the subsequent first plug due to the direction connection between the first gate electrode 271 and the first embedding material.

In the process of etching a portion of the second gate dielectric layer 262 on the sidewalls of the second trench 242, the second embedding material connected to the second gate dielectric layer 262 may be etched and removed, which may disconnect the second gate electrode 272 and the second embedding material and may avoid the leakage between the second gate electrode 272 and the subsequent second plug due to the direction connection between the second gate electrode 272 and the second embedding material.

In one embodiment, in the process of etching a portion of the first dielectric layer 261 on the sidewalls of the first trench 241, a portion of the second dielectric layer 262 on the sidewalls of the second trench 242 may be etched to form the first recess 281 and the second recess 282, and the process may be simplified.

The first recess 281 may be between the first gate electrode 271 and the first spacer 221 and the second recess 282 may be between the second gate electrode 272 and the second spacer 222. The depth of the first recess 281 may be about 270 Angstrom to about 330 Angstrom and the depth of the second recess 282 may be about 270 Angstrom to about 330 Angstrom.

The process of the second gate electrode 272 may have small loss of the surface material at the top of the second gate electrode 272 and the second gate electrode 272 may not be etched during forming the second recesses 282. Correspondingly, before the subsequent trimming and polishing, the height difference between the top surface of the second gate electrode 272 and the surface of the first dielectric layer 230 on the sides of the second gate electrode 272 may be small.

The process of the first gate electrode 271 may have small loss of the surface material at the top of the first gate electrode 271 and the first gate electrode 271 may not be etched during forming of the first recesses 281. Correspondingly, before the subsequent trimming and polishing, the height difference between the top surface of the first gate electrode 271 and the surface of the first dielectric layer 230 on the sides of the first electrode 271 may be small.

Figure 7:
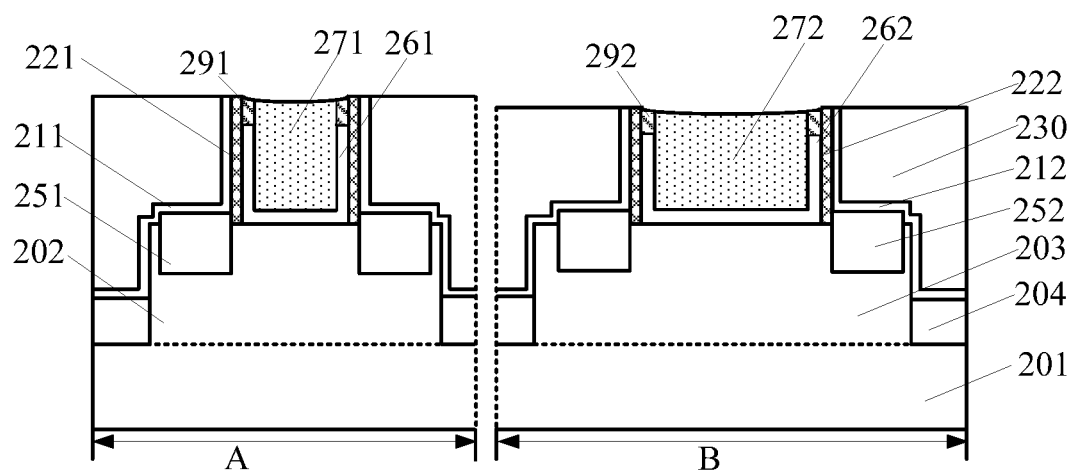

Referring to FIG. 7, a first protection layer 291 which may be in the first recess 281 (referring to FIG. 6) and a second protection layer 292 which may be in the second recess 282 (referring to FIG. 6) may be formed.

The method for forming the first protection layer 291 and the second protection layer 292 may include: forming a protection film in the first recess 281 and the second recess 282, on the first gate electrode 271, the second gate electrode 272, the first spacers 221, the second spacers 222 and the first dielectric layer 230; and forming the first protection layer 291 and the second protection layer 292 by polishing the protection film to expose the top surfaces of the first gate electrode 271 and the second gate electrode 272, the top surfaces of the first spacers 221 and the second spacers 222, and the surfaces of the first dielectric layer 230.

The protection film may be formed by a deposition process such as an atomic layer deposition process. In one embodiment, the process for forming the protection film may be an atomic layer deposition process.

The process for polishing the protection film may include a chemical mechanical polishing process.

The first protection layer 291 may be made of silicon nitride, silicon oxynitride, silicon oxycarbonitride, silicon oxyboronitride, or silicon oxyborocarbonitride. The second protection layer 292 may be made of silicon nitride, silicon oxynitride, silicon oxycarbonitride, silicon oxyboronitride, or silicon oxyborocarbonitride.

The first protection layer 291 may isolate the first gate electrode 271 and the first gate dielectric layer 261 from the first embedding material. The first protection layer 291 may have a large dielectric constant, which improve the breakdown resistance and avoid the leakage between the first gate electrode 271 and the first embedding material.

The second protection layer 292 may isolate the second gate electrode 272 and the second dielectric layer 262 from the second embedding material. The second protection layer 292 may have a large dielectric constant, which improve the breakdown resistance and avoid the leakage between the second gate electrode 272 and the second embedding material.

Figure 8:
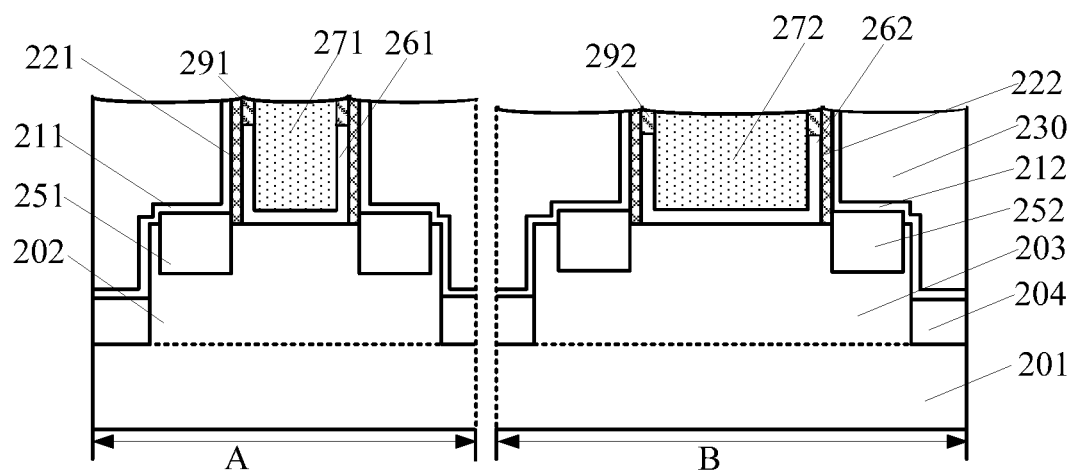

Referring to FIG. 8, using the first gate electrode 271 and the second gate electrode 272 as a stop layer, the surface of the first dielectric layer 230 and the top surfaces of the first protection layer 291 and the second protection layer 292 may be trimmed and polished.

The trimming and polishing process may include a chemical mechanical polishing process.

The trimming and polishing process may reduce the height difference between the surface of the first dielectric layer 230, the first protection layer 291 and the second protection layer 292, and the top surface of the first gate electrode 271 and the second gate electrode 272.

The trimming and polishing process may polish the top surfaces of the first spacers 221 and the second spacers 222, which may reduce the height difference between the top surface of the first spacers 221 and the second spacers 222 and the top surface of the first gate electrode 271 and the second gate electrode 272. The trimming and polishing process may have small loss of the first dielectric layer 230 on the sides of the second gate electrode 272 and the first gate electrode 271 using the first gate electrode 271 and the second gate electrode 272 as the stop layer. Correspondingly, the difference between the thickness of the first dielectric layer 230 on the sides of the second gate electrode 272 and the thickness of the first dielectric layer 230 on the sides of the first gate electrode 271 may be small, which may meet the requirements of the process design and improve the performance of semiconductor devices.

Next, first through holes, which may pass through the first dielectric layer 230 and expose the surfaces of the first source/drain doped layer, may be formed on the sides of the first gate electrode 271. In the process of forming the first through holes, second through holes, which may pass through the first dielectric layer 230 and expose the surfaces of the second source/drain doped layer, may be formed on the sides of the second gate electrode 272.

In one embodiment, the method may further include: before forming the first and second through holes, forming a second dielectric layer on the first protection layer 291, the second protection layer 292, the first gate electrode 271, the second gate electrode 272 and the first dielectric layer 230. The first through holes may further pass through the second dielectric layer on the sides of the first gate electrode 271, and the second through holes may further pass through the second dielectric layer on the sides of the second gate electrode 272.

In one embodiment, the method may further include: before forming the second dielectric layer, forming a third protection layer. In other embodiments, the third protection layer may not be formed.

Figure 9:
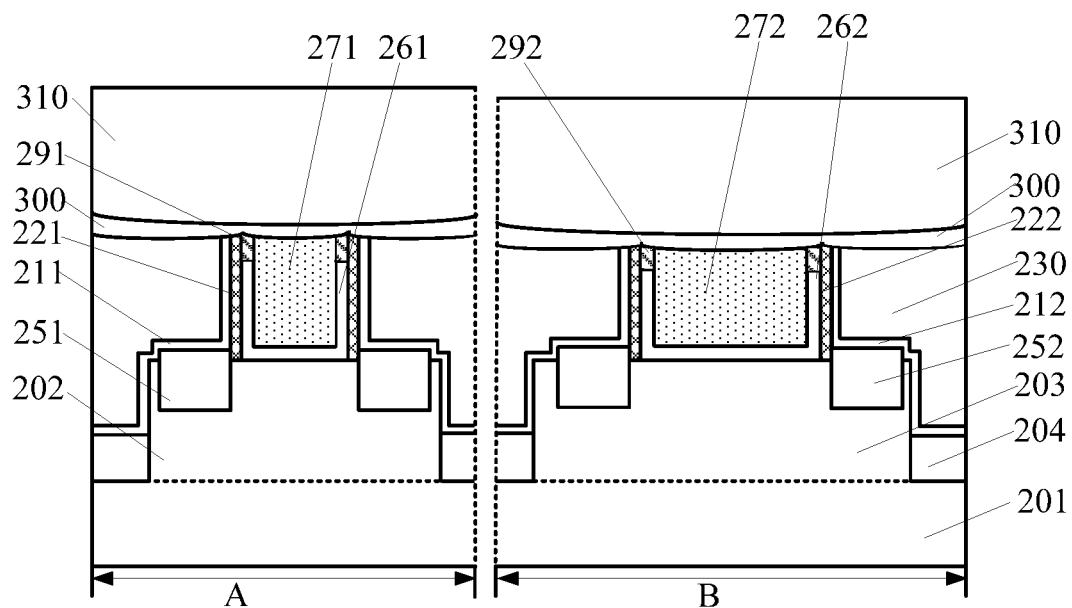

Referring to FIG. 9, the method may include a third protection layer 300 on the top surface of the first protection layer 291, the first gate electrode 271, the second protection layer, the second gate electrode and the first dielectric layer. The dielectric constant of the third protection layer 300 may be larger than the dielectric constant of the first dielectric layer 230.

The process of forming the third protection layer 300 may be a deposition process. The dielectric constant of the third protection layer 300 may be larger than the dielectric constant of the first dielectric layer 230 and the subsequently formed dielectric layer. The third protection layer 300 may be made of silicon nitride, silicon oxynitride, silicon oxycarbonitride, silicon oxyboronitride, or silicon oxyborocarbonitride.

The third protection layer 300 may improve the breakdown resistance and avoid the leakage between the first gate electrode and the subsequent first plug, and may improve the breakdown resistance and avoid the leakage between the second gate electrode and the subsequent second plug.

As illustrated in FIG. 9, a second dielectric layer 310 may be formed on the first protection layer 291, the second protection layer 292, the first gate electrode 271, the second gate electrode 272 and the first dielectric layer 230.

In one embodiment, the second dielectric layer 310 may be on the third protection layer 300 and over the first spacers 221 and the second spacers 222. The second dielectric layer 310 may be on the surface of the third protection layer 300.

The material of the second dielectric layer 310 may include silicon dioxide. The formation process of the second dielectric layer 310 may be a deposition process such as a high-density plasma chemical vapor deposition process.

Figure 10:
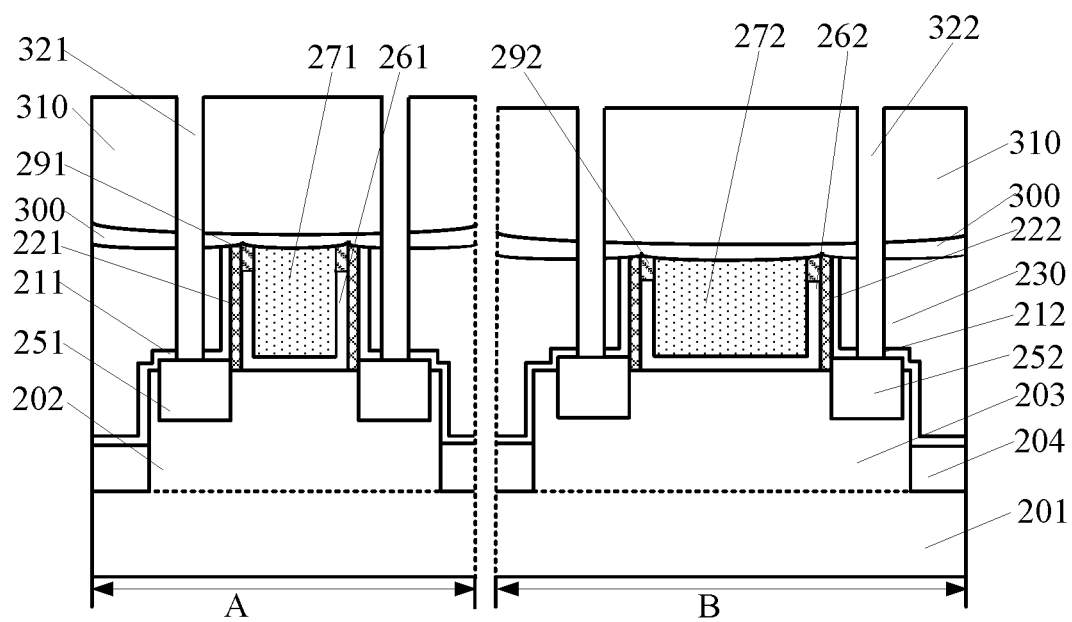
Figure 11:
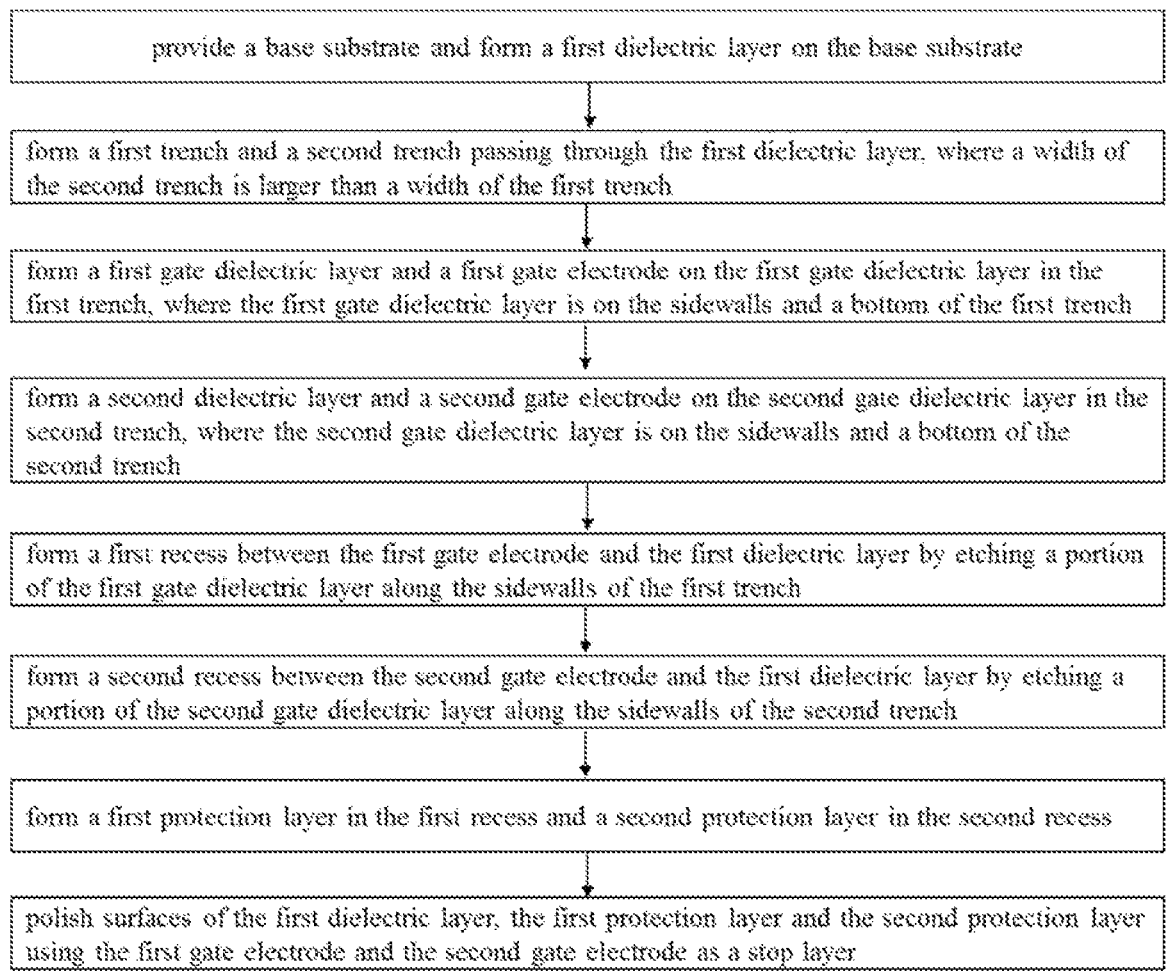
FIG. 11 illustrates an exemplary fabrication method for forming a semiconductor structure according to various disclosed embodiments of the present disclosure.

Referring to FIG. 10, first through holes 321, which may pass through the first dielectric layer 230 and expose the surface of the first source/drain doped layer 251, may be formed on each side of the first gate electrode 271. In the formation process of the first through holes 321, second through holes 322, which may pass through the first dielectric layer 230 and expose the surface of the second source/drain doped layer 252, may be formed on each side of the second gate electrode 272.

In the formation process of the first through holes 321, the second through holes 322 may be formed. A separate process may not be needed to form the first through holes and the second through holes separately, which may simplify the process.

The first through holes 321 may further pass through the third protection layer 300 and the second dielectric layer 310 on the sides of the first electrode 271; the second through holes 322 may further pass through the third protection layer 300 and the second dielectric layer 310 on the sides of the second gate electrode 272.

The first through holes 321 may further pass through the first stop layer 211 and the second through holes 322 may further pass through the second stop layer 212.

Since the difference between the thickness of the first dielectric layer 230 on the sides of the second gate electrode 272 and the thickness of the first dielectric layer 230 on the sides of the first gate electrode 271 may be small, the time for etching the first dielectric layer 230 on the sides of the second gate electrode 272 may be avoided to be much less than the time for etching the first dielectric layer 230 on the sides of the first gate electrode 271. The large loss of the second source/drain doped layer 252 due to forming the first through holes 321 and the second through holes 322 may be further avoided.

In one embodiment, the method may further include: forming the first plugs in the first through holes 321; forming the second plugs in the second through holes 322. The first plugs and the first source/drain doped layer 251 may be connected electrically, and the second plugs and the second source/drain doped layer 252 may be connected electrically.

Correspondingly, this disclosure embodiment also provides a semiconductor device using the above method, as illustrated in FIG. 10, including: a base substrate with the first dielectric layer 230 on the base substrate; the first trench 241 and the second trench 242 (referring to FIG. 4), in the first dielectric layer 230, passing through the first dielectric layer 230, where the width of the second trench may be larger than the width of the first trench; the first gate dielectric layer 261 and the first gate electrode 271 in the first trench 241, where the first gate dielectric layer 261 may be on a portion of the sidewalls and the bottom of the first trench 241 and the first gate electrode 271 may be on the first gate dielectric layer 261; the first recess 281 (referring to FIG. 6) on the first gate dielectric layer 261 between the first gate electrode 271 and the first dielectric layer 230; the second gate dielectric layer 262 and the second gate electrode 272 in the second trench 242, where the second gate dielectric layer 262 may be on a portion of the sidewalls and the bottom of the second trench 242 and the second gate electrode 272 may be on the second gate dielectric layer 262; the second recess 282 (referring to FIG. 6) on the second gate dielectric layer 262 between the second gate electrode 272 and the first dielectric layer 230; the first protection layer 291 in the first recess 281 and the second protection layer 292 in the second recess 282.

The size of the first trench may be about 26 nm to about 30 nm in a direction perpendicular to an extending direction of the first trench and in parallel with a surface of the base substrate; the size of the second trench may be about 65 nm to about 75 nm in a direction perpendicular to an extending direction of the second trench and in parallel with a surface of the base substrate.

The first protection layer 291 may be made of silicon nitride, silicon oxynitride, silicon oxycarbonitride, silicon oxyboronitride, or silicon oxyborocarbonitride; the second protection layer 292 may be made of silicon nitride, silicon oxynitride, silicon oxycarbonitride, silicon oxyboronitride, or silicon oxyborocarbonitride; the material of the first dielectric layer 230 may include silicon dioxide; and the first gate electrode 271 and the second gate electrode 272 may be made of a metal.

The semiconductor device may further include: the first source/drain doped layer 251 in the base substrate on the sides of the first gate electrode 271; the second source/drain doped layer 252 in the base substrate on the sides of the second gate electrode 272; the first dielectric layer 230 over the first source/drain doped layer 251 and the second source/drain doped layer 252; the first through holes 321 on the sides of the first gate electrode 271, which may pass through the first dielectric layer 230 and expose the surfaces of the first source/drain doped layer 251; and the second through holes 322 on the sides of the second gate electrode 272, which may pass through the first dielectric layer 230 and expose the surfaces of the second source/drain doped layer 252.

The semiconductor device may further include: the second dielectric layer 310 on the first protection layer 291, the second protection layer 292, the first gate electrode 271, the second gate electrode 272 and the first dielectric layer 230; the first through holes 321 which may further pass through the second dielectric layer 310 on the sides of the first gate electrode 271; and the second through holes 322 which may further pass through the second dielectric layer 310 on the sides of the second gate electrode 272.

The semiconductor device may further include: the third protection layer 300 on the top surfaces of the first protection layer 291, the first gate electrode 271, the second protection layer, the second gate electrode and the first dielectric layer, where the dielectric constant of the third protection layer 300 may be larger than the dielectric constant of the first dielectric layer 230 and the second dielectric layer 310; the first through holes 321 which may further pass through the third protection layer 300 on the sides of the first gate electrode 271; and the second through holes 322 which may further pass through the third protection layer 300 on the sides of the second gate electrode 272.

The semiconductor device may further include: the first plugs in the first through holes 321; and the second plugs in the second through holes 322. The first plugs and the first source/drain doped layer 251 may be connected electrically, and the second plugs and the second source/drain doped layer 252 may be connected electrically.

In the present disclosure, the first protection layer may isolate the first gate electrode and the first gate dielectric layer from the first embedding material, and the first protection layer may have a large dielectric constant, which may improve the breakdown resistance and avoid the leakage between the first gate electrode and the first embedding material. The second protection layers may isolate the second gate electrode and the second gate dielectric layer from the second embedding material, and the second protection layer may have a large dielectric constant, which may improve the breakdown resistance and avoid the leakage between the second gate electrode and the second embedding material. The trimming and polishing of the first dielectric layer may reduce the height difference between the surface of the first dielectric layer and the first/second protection layers, and the surface of the first and second gate electrodes. The width of the second trench may be larger than the width of the first trench. Even though the second gate electrode may have large hardness, the process for forming the second gate electrode may have small loss of the surface material at the top of the second gate electrode. The second gate electrode may also not be etched during forming the second recess. Correspondingly, before the subsequent trimming and polishing, the height difference between the top surface of the second gate electrode and the surface of the first dielectric layer on the sides of the second gate electrode may be small. Since the first gate electrode may have large hardness, the process for forming the first gate electrode may have small loss of the surface material at the top of the first gate electrode. The first gate electrode may also not be etched during forming the first recess. Correspondingly, before the subsequent trimming and polishing, the height difference between the top surface of the first gate electrode and the surface of the first dielectric layers on the sides of the first electrode may be small. The trimming and polishing process may have small loss of the first dielectric layer on the sides of the second gate electrode and the first gate electrode using the first gate electrode and the second gate electrode as the stop layer. Correspondingly, the difference between the thickness of the first dielectric layer on the sides of the second gate electrode and the thickness of the first dielectric layer on the sides of the first gate electrode may be small, which may meet the requirements of the process design and improve the performance of semiconductor devices.

In the present disclosure, the first through holes, which may pass through the first dielectric layer and expose the surfaces of the first source/drain doped layer, may be formed on the sides of the first gate electrode. In the process of forming the first through holes, the second through holes, which pass through the first dielectric layer and expose the surfaces of the second source/drain doped layer, may be formed on the sides of the second gate electrode. The difference between the thickness of the first dielectric layer on the sides of the second gate electrode and the thickness of the first dielectric layer on the sides of the first gate electrode may be small, and the time of etching the first dielectric layer on the sides of the second gate electrode may be avoided to be much less than the time of etching the first dielectric layer on the sides of the first gate electrode. The large loss of the second source/drain doped layer during forming the first and second through holes may be further avoided.

In the present disclosure, the first recess on the first gate dielectric layer may be located between the first gate electrode and the first dielectric layer, and the top surface of the first gate electrode and the top surface of the first dielectric layer surrounding the first gate electrode may have similar height. The second recess on the second gate dielectric layer may be located between the second gate electrode and the first dielectric layer, and the top surface of the second gate electrode and the top surface of the first dielectric layer surrounding the second gate electrode may have similar height. Because of small height difference between the top surface of the first gate electrode and the top surface of the second gate electrode, the difference between the thickness of the first dielectric layer on the sides of the second gate electrode and the thickness of the first dielectric layer on the sides of the first gate electrode may be small, which may meet the requirements of the process design and improve the performance of semiconductor devices.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor device, comprising:
a base substrate;
a first dielectric layer on the base substrate, wherein the first dielectric layer contains a first trench and a second trench passing therethrough, and a width of the second trench is larger than a width of the first trench;
a first gate dielectric layer and a first gate electrode in the first trench, wherein the first gate dielectric layer is on a portion of sidewalls and a bottom of the first trench, the first gate electrode is on the first gate dielectric layer, and a first recess is on the first gate dielectric layer between the first gate electrode and the first dielectric layer;
a second gate dielectric layer and a second gate electrode in the second trench, wherein the second gate dielectric layer is on a portion of sidewalls and a bottom of the second trench, the second gate electrode is on the second gate dielectric layer, and a second recess is on the second gate dielectric layer between the second gate electrode and the first dielectric layer;
a first protection layer in the first recess; and
a second protection layer in the second recess.

2. The device according to claim 1, wherein:
a size of the first trench is about 26 nm to about 30 nm, in a direction perpendicular to an extending direction of the first trench and in parallel with a surface of the base substrate; and
a size of the second trench is about 65 nm to about 75 nm, in a direction perpendicular to an extending direction of the second trench and in parallel with the surface of the base substrate.

3. The device according to claim 1, wherein:
the first protection layer is made of a material including silicon nitride, silicon oxynitride, silicon oxycarbonitride, silicon oxyboronitride, silicon oxyborocarbonitride, or a combination thereof;
the second protection layer is made of a material including silicon nitride, silicon oxynitride, silicon oxycarbonitride, silicon oxyboronitride, silicon oxyborocarbonitride, or a combination thereof;
the first dielectric layer is made of a material including silicon dioxide; and
the first gate electrode and the second gate electrode are made of a material including a metal.

4. The device according to claim 1, further including:
the first source/drain doped layer in the base substrate on the sides of the first gate electrode;
the second source/drain doped layer in the base substrate on the sides of the second gate electrode;
the first dielectric layer, which is over the first and second source/drain doped layers;
first through holes on the sides of the first gate electrode passing through the first dielectric layer and exposing the surfaces of the first source/drain doped layer; and
second through holes on the sides of the second gate electrode passing through the first dielectric layer and exposing the surfaces of the second source/drain doped layer.

5. The device according to claim 4, further including:
a second dielectric layer on the first protection layer, the second protection layer, the first gate electrode, the second gate electrode and the first dielectric layer, wherein:
the first through holes further pass through the second dielectric layer on the sides of the first gate electrode and the second through holes further pass through the second dielectric layer on the sides of the second gate electrode.

6. The device according to claim 5, further including:
a third protection layer on the surfaces of the first protection layer, the first gate electrode, the second protection layer, the second gate electrode and the first dielectric layer, wherein:
a dielectric constant of the third protection layer is larger than each dielectric constant of the first dielectric layer and the second dielectric layer;
the second dielectric layer is on the third protection layer, and
the first through holes further pass through the third protection layer on the sides of the first gate electrode and the second through holes further pass through the third protection layer on the sides of the second gate electrode.

7. The device according to claim 4, further including:
first plugs in the first through holes, wherein the first plugs and the first source/drain doped layer are connected electrically; and
second plugs in the second through holes, wherein the second plugs and the second source/drain doped layer are connected electrically.

8. The device according to claim 1, further including:
first spacers formed on the sidewalls of the first trench, wherein the first spacers are between the first gate dielectric layer and the first dielectric layer; and
second spacers formed on the sidewalls of the second trench, wherein the second spacers are between the second gate dielectric layer and the first dielectric layer, and the first recess is between the first gate electrode and the first spacer and the second recess is between the second gate electrode and the second spacer.

9. The device according to claim 4, further including:
a first stop layer on the top of the first source/drain doped layer, and
a second stop layer on the top of the second source/drain doped layer, wherein:
the first dielectric layer also cover the first and second stop layers; and the first through holes further pass through the first stop layer and the second through holes further pass through the second stop layer.

10. The device according to claim 9, wherein:
a thickness of the first stop layer is about 4.5 nm to about 5.5 nm, and
a thickness of the second stop layer is about 4.5 nm to about 5.5 nm.

11. The device according to claim 9, wherein:
the first stop layer is made of silicon nitride, silicon oxynitride, silicon oxycarbonitride, silicon oxyboronitride, or silicon oxyborocarbonitride and
the second stop layer is made of silicon nitride, silicon oxynitride, silicon oxycarbonitride, silicon oxyboronitride, or silicon oxyborocarbonitride.

\* \* \* \* \*